(12) United States Patent
Hwang et al.

(10) Patent No.: US 6,185,085 B1
(45) Date of Patent: Feb. 6, 2001

(54) SYSTEM FOR TRANSPORTING AND ELECTROSTATICALLY CHUCKING A SEMICONDUCTOR WAFER OR THE LIKE

(75) Inventors: Yuan-Ko Hwang, Hualien; Tsung-Chi Hsieh, Tamshui, both of (TW)

(73) Assignee: Taiwan Semiconductor Manufacturing Co., Ltd., Hsin Chu (TW)

( * ) Notice: Under 35 U.S.C. 154(b), the term of this patent shall be extended for 0 days.

(21) Appl. No.: 09/203,854

(22) Filed: Dec. 2, 1998

(51) Int. Cl.$^7$ ................................................. H01G 23/00
(52) U.S. Cl. ................................................. 361/234
(58) Field of Search ................................. 361/234, 115

(56) References Cited

U.S. PATENT DOCUMENTS 4,733,632 * 3/1988 Ohmi et al. .......................... 361/234
5,117,121 * 5/1992 Watanabe et al. ................... 361/234

\* cited by examiner

*Primary Examiner*—Stephen W. Jackson
(74) *Attorney, Agent, or Firm*—Tung & Associates

(57) ABSTRACT

An electrostatic arm transports a semiconductor wafer between a staging area and a processing chamber and also electrically charges the wafer in order to eliminate the need for using gas plasma in the chamber to chuck and dechuck the wafer. The arm includes a pair of electrically conductive members coupled with an electrical power supply which respectively control the polarity of the charge applied to the wafer and create an electrostatic force which holds the wafer on the arm without the need for mechanical clamping. One of the members comprises a plate spaced from the face of the wafer by an air gap, and when charged with a polarity opposite that of the wafer, creates an electrostatic attraction force which holds the wafer the carrier. A controller is used to selectively reverse the polarity of charge on the plate so as to create an electrostatic repulsion force which positively releases the wafer from the carrier.

8 Claims, 5 Drawing Sheets

SYSTEM FOR TRANSPORTING AND ELECTROSTATICALLY CHUCKING A SEMICONDUCTOR WAFER OR THE LIKE

TECHNICAL FIELD

The present invention generally relates to apparatus and techniques for processing semiconductor devices, such as semiconductor wafers, and deals more particularly with apparatus for transporting and electrostatically chucking the wafer for processing within a processing chamber.

BACKGROUND OF THE INVENTION

Semiconductor wafers used to fabricate integrated circuits are processed in vacuum chambers using common semiconductor processing techniques, such as CVD, sputtering and etching. The wafer must be securely held in a fixed position within the chamber, and means must be provided to carefully control the temperature of the wafer. In many cases, a cooling gas, such as helium is supplied to the backside of the wafer which serves as a heat transfer medium to assist in controlling wafer temperature.

Various techniques have been used in the past to hold the wafer in a desired position within the chamber. Early techniques involved mechanically clamping the topside of the wafer while providing cooling gasses to the backside; this approach is sometimes referred to as "top side clamping", but has not proved particularly effective, in large part because it suffers from the disadvantage of causing non-uniformity and particle inconsistencies at the extreme edge of the wafer.

More recently, electrostatic clamping has found increasing use. This technique makes use of the electrostatic attraction between objects of different electrical potentials, and commonly employs an electrostatic chuck as the device for providing electrostatic clamping forces. Electrostatic chucks are based on the forces of attraction between the charged plates of a capacitor. As in other types of wafer clamping and chucking, cooling gasses to control wafer temperature are supplied to the backside of the wafer, consequently the clamping force resulting from electrostatic forces must be sufficient to overcome the backside pressure on the wafer resulting from application of the heat transfer medium. The electrostatic chuck can be thought of as a capacitor with a conductive plate (a lower electrode fixed within the processing chamber), an insulating layer (a coating on the electrode), and another conductive plate (the wafer). In effect, the chuck is a parallel plate capacitor with a dielectric spacer. In its simplest form, this type of electrostatic chuck is referred to as a unipolar or monopolar electrostatic chuck. A unipolar electrostatic chuck is simply a conducting electrode with the wafer being employed as one of the conducting plates. In order to establish a complete circuit, an electrical connection to the wafer is required.

Currently, most unipolar electrostatic chucks use the gas plasma within the chamber as a conductor which completes the electrical circuit necessary to provide the electrostatic clamping force. A significant drawback of unipolar electrostatic chucks is the fact that the actual clamping force is not applied to the wafer until the wafer has been charged and the plasma has been generated in the chamber, the combination of which results in "chucking" the wafer on the electrode. Although an electrical conductor could be used to contact the wafer in lieu of the electrically conductive plasma, such contact could have serious consequences in terms of process reliability and reproducibility. After the wafer is electrostatically "chucked", the desired process is carried out in the chamber, following which it is necessary to unclamp the wafer. Wafer unclamping is achieved by removing the plasma from the chamber and bleeding off the electrical charge existing in the wafer; this step is commonly referred to as "de-chucking" the wafer. The speed and effectiveness of de-chucking are highly dependent upon the particular processes that have been previously carried out in the chamber. Simply turning off the voltage source to the chuck electrode with the plasma still present will not always result in instantaneous de-chucking since some residual charge may remain in the wafer. In any event, in addition to less than optimal process repeatability, the time required for chucking and de-chucking the wafer necessarily increases the overall time required to process a particular wafer, and thus reduces wafer throughput to the system.

Another type of electrostatic chuck referred to as a bipolar chuck is sometimes used, which is constructed from a pair of electrodes separated from the wafer by an insulating layer. The bipolar configuration has the disadvantage of being considerably more complex in construction than the unipolar configuration and typically generates a clamping force which is considerably less that of a comparably sized unipolar chuck.

It would therefore be desirable to provide a unipolar type electrostatic chuck which is capable of chucking and de-chucking the wafer without the need for using the plasma within the chamber to complete the circuit necessary for creating the electrostatic chucking force. The present invention is directed to satisfying this requirement.

SUMMARY OF THE INVENTION

According to one aspect of the invention, an electrostatic chuck and transport system is provided for holding an electrically conductive workpiece, such as a semiconductor wafer or the like, within a processing chamber. The system includes an electrode within the chamber upon which the wafer may be electrostatically clamped. An electrostatic arm is provided for transporting the wafer from a staging position, such as a cassette or loadlock chamber, to a position within the chamber in proximity to the electrode. The electrostatic arm includes an electrically conductive contacting member for engaging the wafer and applying an electric charge to the wafer having a polarity opposite of that of the polarity of the electrode. The arm further includes an electrically conductive plate member that may be charged with an electrical potential which either electrostatically attracts, and therefore clamps the wafer to the arm, or repels the wafer and thereby releases the wafer from the arm. Electrical power supply means, as well as control means are provided for selectively charging the electrode, contacting member and plate member with the desired polarities so as to electrostatically clamp and unclamp the wafer to the arm, while at the same time pre-charging the wafer before the latter is deposited and electrostatically clamped onto the electrode. The contacting member and plate member are separated by a layer of insulation and are concentrically disposed within an outer housing formed of electrically insulated material.

According to another aspect of the invention, apparatus for transporting and charging the wafer is provided for use in an electrostatic chuck. The apparatus includes a carrier moveable between stand by and staged positions, electrical power supply means, an electrically conductive contact member on the carrier which is coupled with the power supply for electrically contacting the wafer and for applying an electrical charge to the wafer; an electrical conductive plate member on the carrier which is coupled with the power supply for selectively electrostatically attracting or repelling the wafer; means on the wafer for electrically insulating the contact member from the plate member; and, means for controlling the power and the polarity of the power supplied from the power supply to the plate member and the contacting member.

Accordingly, it is the primary object of the present invention to provide an electrostatic chucking system which substantially increases wafer throughput by eliminating the need for employing a gas plasma as an electrically conductive medium.

Another object of the invention is to provide a system as described above for transporting wafers from a staging area to a chamber while simultaneously charging the wafer.

A further object of the present invention is to provide a system of type mentioned above which utilizes an electrostatic clamping force for holding the wafer during transport from a staging area to chamber.

A further object of the present invention is to provide an electrostatic arm which is particularly simple in construction and can be used to both transport and pre-charge a wafer, without the need for mechanically clamping the wafer.

These, and further objects and advantages of the present invention will be made clear or will become apparent during the course of the following description of a preferred embodiment of the present invention.

DETAILED DESCRIPTION OF THE PREFERRED EMBODIMENT

Figure 4:
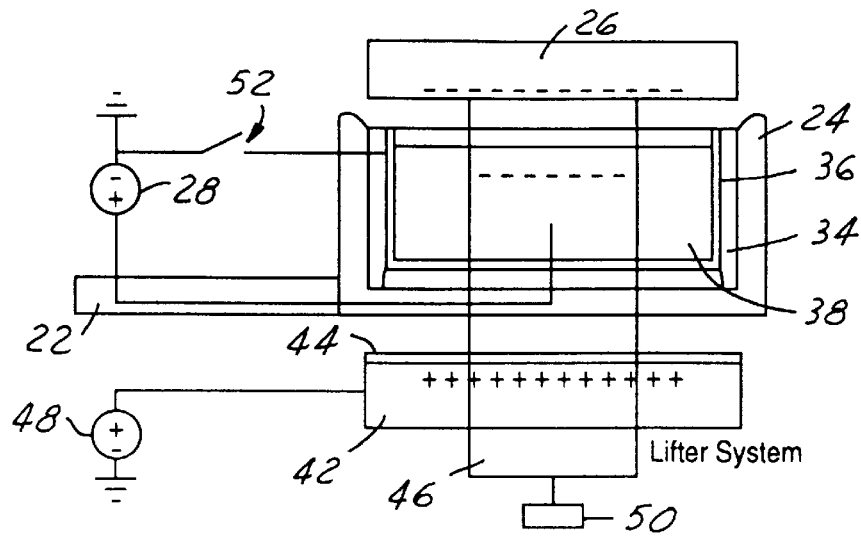
FIG. 4 is a view similar to FIG. 3 but showing the wafer lifted off of the arm.
Figure 5:
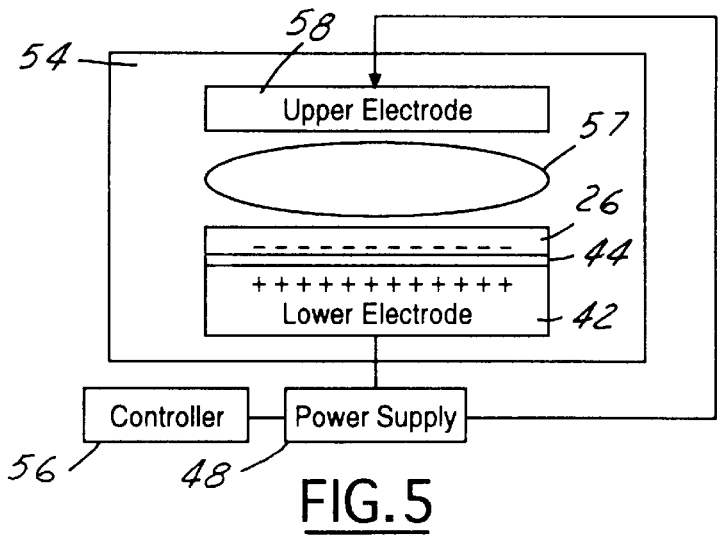
FIG. 5 is a combined block and diagrammatic view of a semiconductor processing chamber, and showing the wafer electrostatically clamped on the electrode within the chamber.
Figure 6:
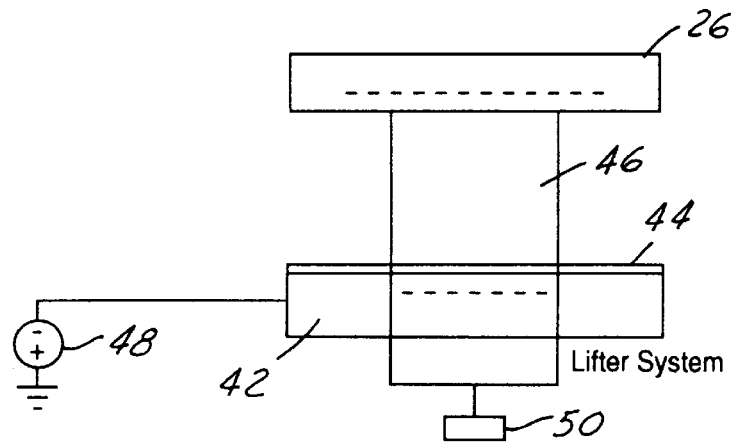
FIG. 6 is a diagrammatic view showing the wafer raised by the lifting mechanism above the electrode.
Figure 7:
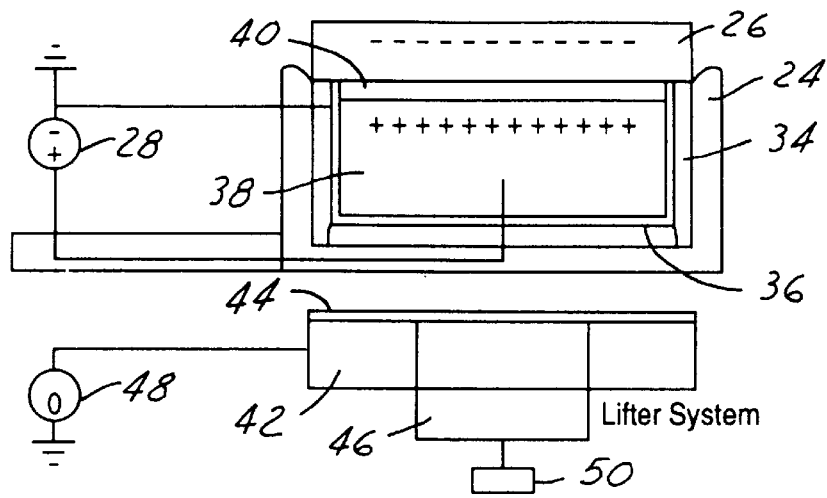
FIG. 7 is a view similar to FIG. 3 but showing a subsequent step.
Figure 8:
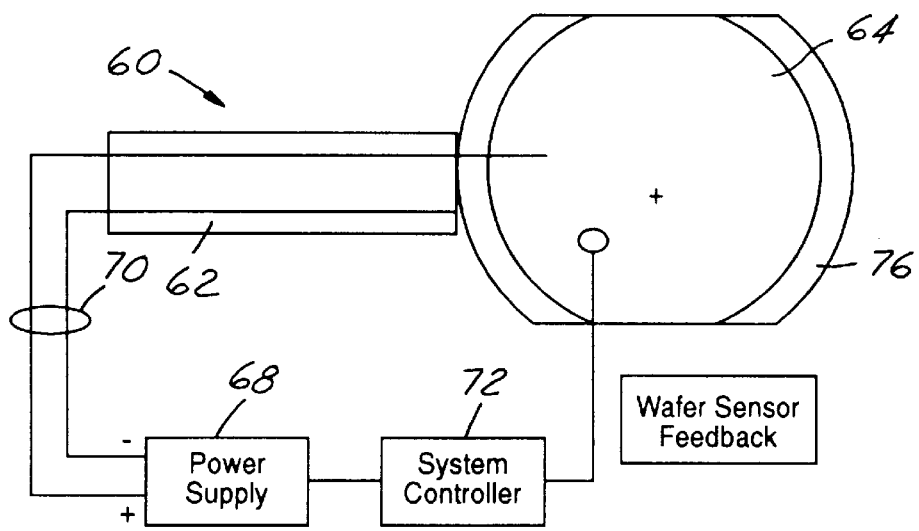
FIG. 8 is a combined block and diagrammatic view of an alternate form of the electrostatic arm of the present invention.
Figure 9:
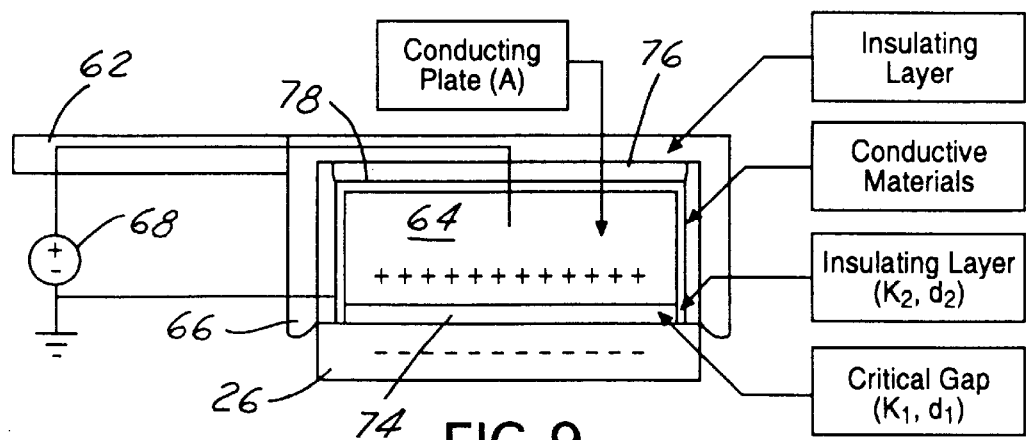
FIG. 9 is a combined schematic and cross sectional view of the arm of FIG. 8 showing the wafer electrostatically clamped on the arm.
Figure 10:
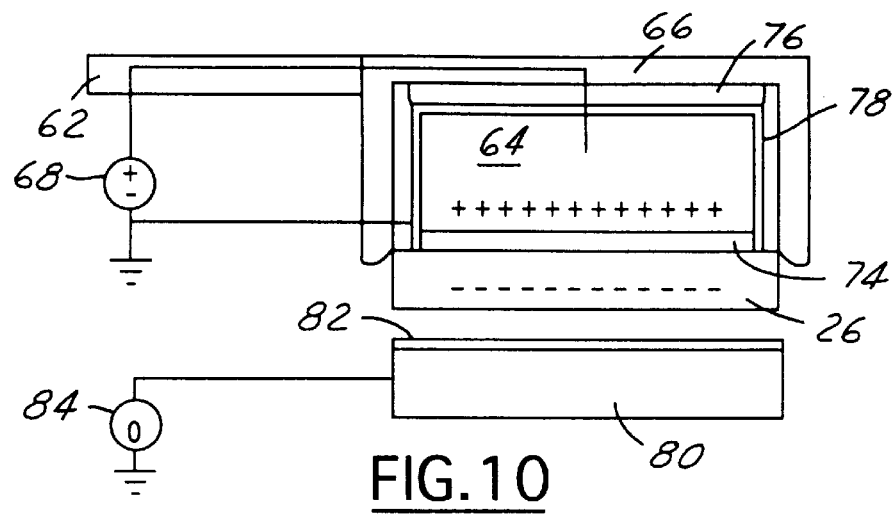
FIG. 10 is a view similar to FIG. 9 but showing the arm having transported the wafer to a staging position, in proximity to the electrode.
Figure 11:
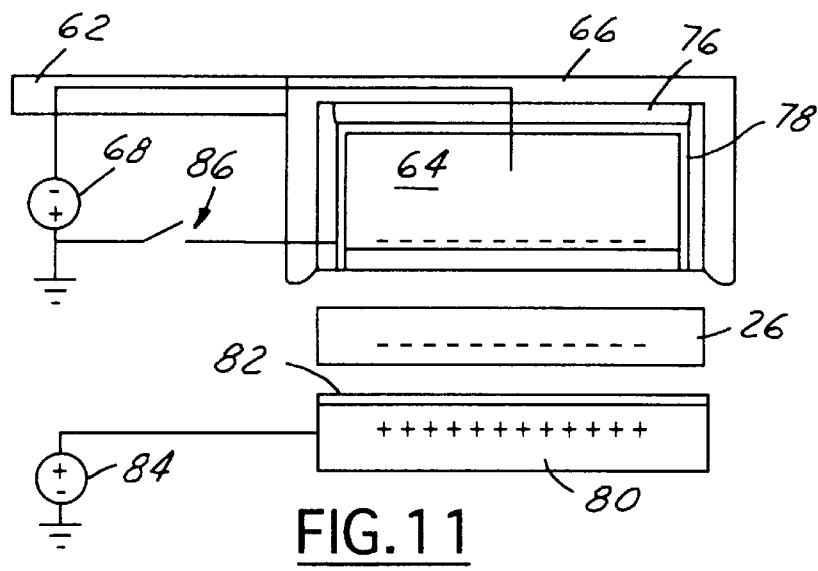
FIG. 11 is a view similar to FIG. 10 but showing a subsequent processing step in which the wafer is released from the arm for deposit onto the electrode.
Figure 12:
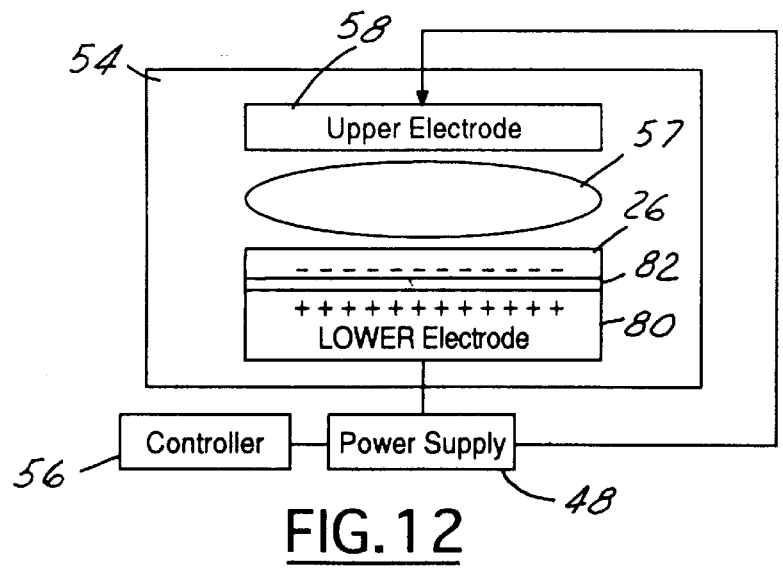
FIG. 12 is a combined block and diagrammatic view of a semiconductor processing chamber.
Figure 13:
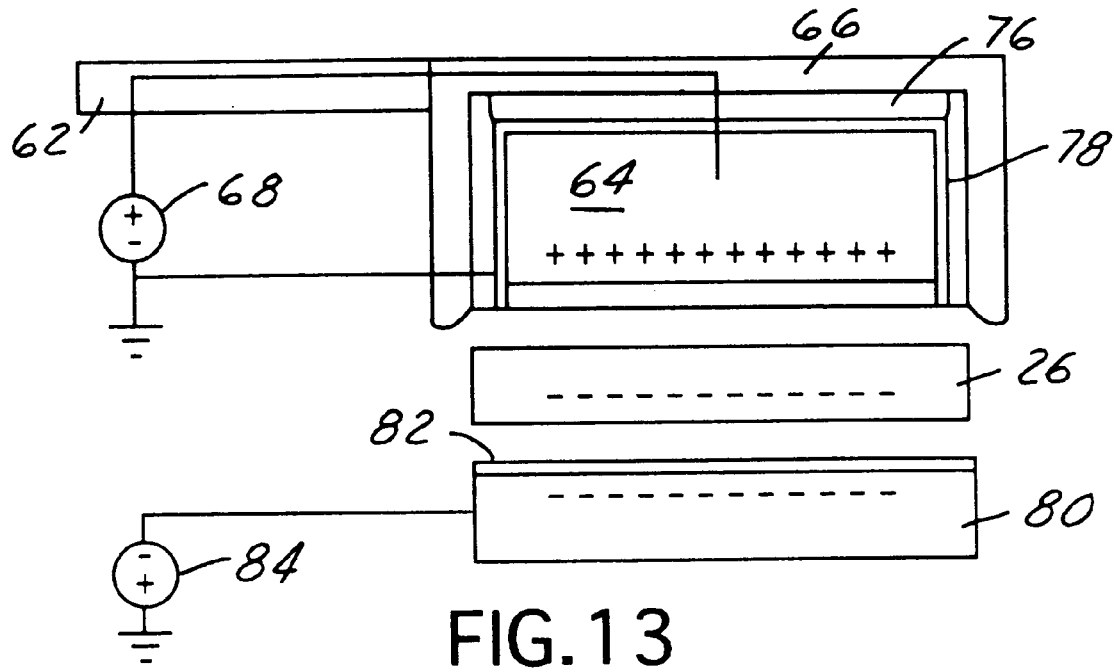
FIG. 13 is a view similar to FIG. 11 but showing the reversal of the charge on the electrode and the plate, in preparation for chucking the wafer onto the arm.
Figure 14:
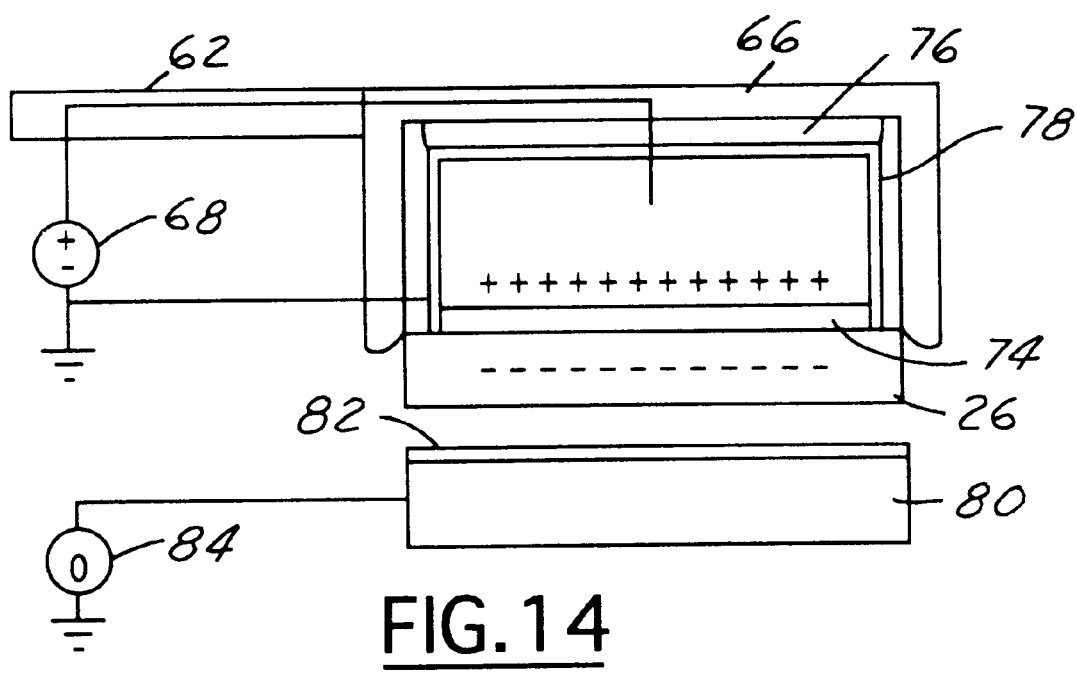
FIG. 14 is a view similar to FIG. 13 but showing a subsequent step in which the wafer has been chucked onto the arm in preparation for return transport to the staging area.

Referring first to FIGS. 1–7, inclusive, the present invention generally relates to an electrostatic chucking system employing an inventive electrostatic arm, generally indicated by the numeral 20, for transporting an electrically conductive workpiece, such as the semiconductor wafer 26 between a staging position and a work area within a semiconductor processing chamber 54 (FIG. 5). The staging position may comprise, for example, a cassette or other holding area within a load lock chamber, and the work area within the processing chamber may comprise an electrically conductive substrate, such as an electrode 42 which is employed to electrostatically clamp the wafer 26 in a fixed position within the chamber during processing. The process carried out on the wafer 26 within the chamber may be one of several common processes such as CVD, etching, or sputtering. As will become later apparent, the arm 20 is utilized not only to transport the wafer 26, but also controls the electrostatic charge applied to the wafer 26.

Although not specifically shown herein, it is to be understood that the arm 20 will include any various types of conventional mechanisms to move the arm vertically and horizontally in a rectilinear or curvilinear fashion. The details of such mechanisms depend on the particular application and are well known in the art, consequently they need not be described in detail herein.

Figure 1:
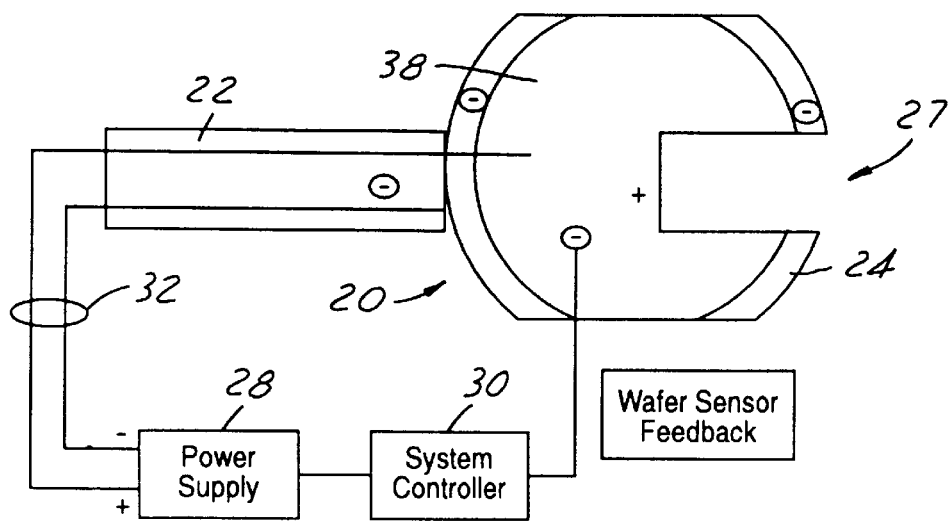
FIG. 1 is a combined block and top plan view of an electrostatic arm forming one embodiment of the present invention.
Figure 2:
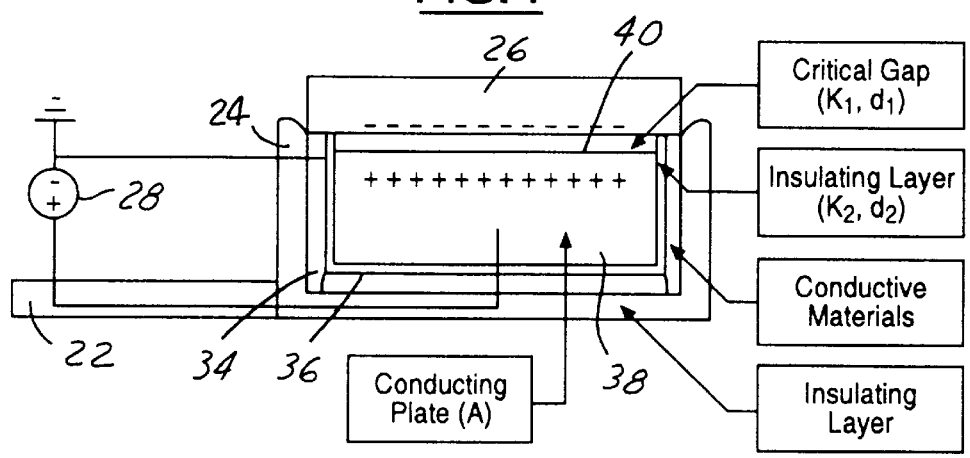
FIG. 2 is a combined schematic and cross-sectional view of the arm of FIG. 1, with a semiconductor wafer loaded thereon.
Figure 3:
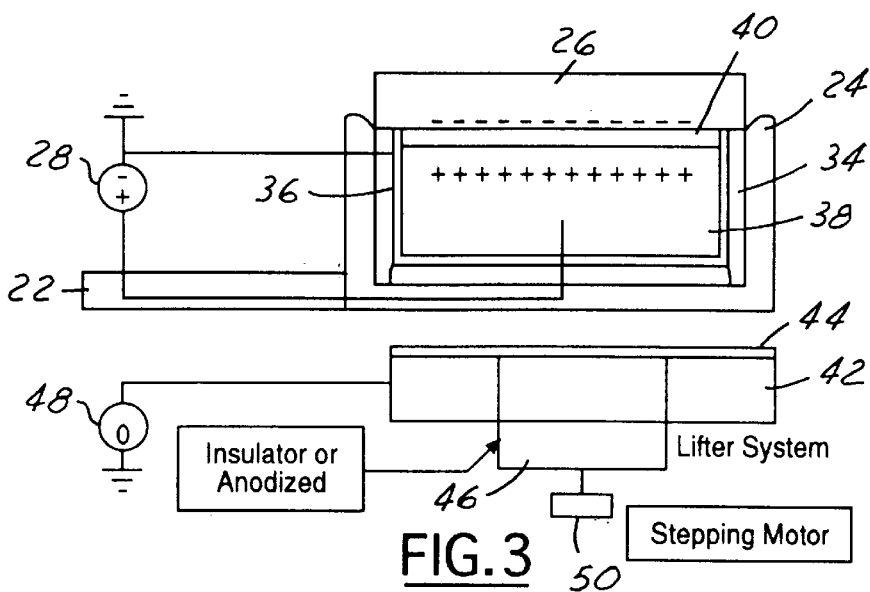
FIG. 3 is a view similar to FIG. 2 but further showing an electrode and a lifting mechanism for transporting the wafer between the electrode and the arm.

The arm 20 includes a elongate arm section 22 connected with a generally cylindrical outer housing 24 provided with an open top and a closed bottom. The arm section 22 and housing 24 are formed of an electrically insulative material, such as plastic for example. Within the outer housing 24, there is sleeved an electrically conductive contact member 34 shaped in the form of a cup having a cylindrical sidewall and a bottom concentrically disposed within the outer housing 24. The upper edge of the contacting member 34 forms a face to face ring contact with the backside face of the wafer 24. In the embodiment shown in FIGS. 1–7, the contact member 34 forms a ring shaped support upon which the circumferential periphery of the wafer 26 rests. As shown in FIG. 2, the upper circumferential edge of the housing 24 is beveled outwardly and extends slightly above the upper edge of the contact member 34 and thus aids in guiding the outer periphery of the wafer 24 into registered engagement with the contact member 34, thus assuring good electrical continuity therebetween.

Concentrically disposed within the contact member 34 is an electrically conductive plate 38 which is separated and electrically insulated from contact member 34 by means of a layer 36 of insulation. The plate 38 is spaced slightly below the upper edge of contact member 34 to form an air gap 40 between such upper face and the bottom or backside face of the wafer 26. The upper surface of plate 38 is also coated with a layer of insulating material.

As best seen in FIGS. 3–6, an electrically conductive substrate in the form of an electrode 42 is disposed within the processing chamber 54 and acts as a chuck body for holding the wafer 26 during processing. The electrode 42 is provided with a layer 44 of electrically insulated material which forms an insulative barrier between the electrode 42 and the wafer 26.

The system includes electrical power supply means comprising a first voltage source 28 coupled with the electrostatic arm 20 by means of a pair of lead wires 32, and a second voltage source 48 coupled with the electrode 42. One of the electrical leads 32 is connected with the contacting member 34, while the other of such leads is coupled with the plate member 38. The system further includes a controller 30 for controlling the power supply 28. The controller 30 includes a series connected switch 52 (FIG. 4) connected between the voltage source 28 and the contact member 34. The controller 30 is operative to selectively connect or disconnect the voltage source from the arm 20, as well as to change the polarity of the leads, and thus the polarity of the electrical charge applied to the contact member 34 and plate 38.

A conventional lifting mechanism 46 formed of an electrically insulative material and driven by a suitable motor source such as stepping motor 50, is disposed beneath the electrode 42. Lifter 46 is operative to transport the wafer 26 between the arm 20 and the electrode 42. When the arm 20 is shifted to its staged position in vertical alignment with the electrode 42, lifter 46 is raised to contact the wafer 26 and lift the latter above the elevation of the arm 20, as best seen in FIG. 4. Stepper motor 50 is then actuated to lower the lifter 46 so that the wafer 26 descends onto the electrode 42. The lifter mechanism 46 is conventional in design and may be placed immediately below the electrode 42, in which case certain components of the arm 20 are provided with a cut away 27 (FIG. 1) to accommodate travel of the lifter 46.

As shown in FIG. 5, the processing chamber 54 houses an upper electrode 58 and a lower electrode 42 upon which the wafer 26 rests. Lower and upper electrodes 42, 58 are coupled with the power supply 48 which in turn is controlled by a second controller 56. A high voltage applied to the lower and upper electrodes 42, 58 ionizes a gas introduced into the chamber 54 to create a gas plasma 57 within the chamber 54 used in processing the wafer 26.

In use, the first step in chucking a wafer 26 for processing consists of moving the electrostatic arm 20 to a cassette or load station (not shown) where a wafer 26 to be processed is present. Controller 30 then turns on the power supply 28 resulting in the application of a voltage to the arm 20 which produces a positive charge on the plate 38 and a negative charge on the contact member 34. The arm 20 and wafer 26 are then relatively moved to place the wafer 26 on the arm 20 such that the outer periphery of the backside of the wafer 26 rests upon the upper edge of the contact member 34. Since contact member 34 is negatively charged, and is in contact with the wafer 26, wafer 26 also becomes negatively charged. Because the plate 38 is positively charged, electrostatic attractive force is created between the wafer 26 and plate 38 which clamps or "chucks" wafer 26 onto the arm 20.

Arm 20 may then be rapidly moved so as to transport the wafer 26 into the process chamber 54, to a position vertically aligned with the electrode 42. At this point, switch 52 (FIG. 4) is opened and the polarity of the voltage supplied by source 28 is reversed, thereby applying a negative charge to the plate member 38. Since wafer 26 carries a residual negative charge, an electrostatic force of repulsion is created between the plate 38 and wafer 26. Motor 50 is actuated to raise lifter 46 until the latter contacts and elevates the wafer 26 above the arm 20, as best seen in FIG. 4. The arm 20 is then retracted away from the chamber, whereupon lifter 46 descends to place the negatively charged wafer 26 upon the electrode 42. Then controller 56 operates the power supply 48 to apply a positive charge to the lower electrode 42 thus clamping or "chucking" the wafer 26 in place within the chamber 56. Backside cooling of the wafer 26 is then commenced, following which the process (CVD, sputtering, etching, etc.) may be started within the chamber 52. As the process is started, a gas plasma 57 is created within the chamber 52 which acts as a conductor to complete a circuit loop between the power supply 48, electrode 42 and wafer 26. The amount of the electrostatic force chucking the wafer 26 onto the electrode 42 may be varied by the controller 56 which operates the voltage to the power supply 48.

After processing of the wafer 26 in the chamber 54 is complete, the plasma within the chamber 54 is no longer present, but the wafer 26 retains a negative residual charge. Controller 56 then reverses the polarity of the power supply 48 (FIG. 6), thus changing the polarity of the charged electrode 42 from positive to negative. With both electrode 42 and wafer 26 negatively charged, an electrostatic repulsion force therebetween is created which "de-chucks" the wafer 26. At this point motor 50 is actuated to cause the lifter 46 to raise the wafer 26 and arm 20 is then again shifted into the chamber and power supply 28 is energized to place a positive charge on the plate 38, and a negative charge on the contact member 34. Lifter 46 is lowered so that wafer 26 is deposited on the arm 20, resulting in the wafer 26 being electrostatically chucked onto the arm 20. The arm 20 is then shifted to transport the processed wafer to the staging position at a load lock or cassette.

Attention is now directed to FIGS. 8–14 which depict an alternate, preferred form of the electrostatic chucking system of the present invention. The system broadly includes an electrostatic arm, generally indicated by the numeral 60 which includes essentially the same components as the arm 20 previously described, except that the components are inverted. More specifically, the arm 60 includes an elongated arm section 62, an outer housing 66 formed of electrically insulated material. A cylindrically shaped contact member 76 is sleeved within the cylindrical body of housing 66, and includes a closed top or end wall, and an open bottom. A plate member 64 is concentrically disposed within the cylindrical contact member 76, and has its lower face spaced from the bottom edge of the contact member 76 to form an air gap 74 between the wafer 26 to be transported and the plate 64. The lower surface of plate 64 is also coated with an insulating material. A layer of electrically insulative material 78 is provided between the plate 64 and the contact member 76. The lower edge of the housing section 66 extends down past the lower edge of contact member 76 and is slightly beveled to assist in bringing the wafer 26 into registered contact with the contact member 76.

While the electrostatic arm 60 shown in FIGS. 8–14 is similar to arm 20 shown in FIGS. 1–7, the system of FIGS. 8–14 does not employ the previously described lifter mechanism, but rather relies on electrostatic chucking of the wafer 26 on the arm 60 and movement of the arm 60 itself to transport the wafer 26 from the staging position directly onto the electrode, designated in FIGS. 8–14 by the numeral 80. As in the case of the previous embodiment, electrode 80 is provided with a layer of insulation 82 which electrically insulates the electrode 80 from the wafer 26. Power supply means are provided comprising first and second voltage sources 68, 84 which respectively apply power to the arm 60 and electrode 80.

The wafer transport sequence using the arm 60 may be described as follows: the arm 60 is first moved to the staging position (cassette or load station) and the arm 60 is then energized by the power source 68 which applies a positive charge to the plate 64 and a negative charge to the contact member 76. The arm 60 is then moved downwardly so the lower edge of the contact member 76 engages the wafer 26. With the plate 64 positively charged, and the wafer 26 negatively charged, via the negatively charged contact member 76, the wafer 26 is electrostatically chucked and therefore clamped onto the arm 60. The arm 60 then moves into the chamber 54 and downwardly to place the negatively charged wafer 26 onto the electrode 80. Switch 86 is open to remove power from the arm 60, whereupon the plate 64 reverses charge from positive to negative, thus releasing the negatively charged wafer 26. Power supply 84 is then actuated to apply a positive charge to the electrode 80 which attracts and therefore electrostatically chucks the negatively charged wafer 26 onto the electrode 80.

The arm 60 is then shifted out of the chamber following which back side cooling is provided to the wafer 26 and the process within the chamber 54 may be commenced,. Again, a gas plasma 57 is created within the chamber 54 and the process (CVD, sputtering, etching, etc.) is carried out during which time the plasma again acts as a conductor closing a circuit loop between the power supply 84, electrode 80 and wafer 26. As in the previously described embodiment, the controller 56 controls the voltage output by the power supply which in turn determines the magnitude of the electrostatic chucking force applied to the wafer 26. Upon completion of the process, the plasma is terminated but the negative charge remains in the wafer 26. The arm 60 is then moved into the chamber, and down into close proximity to the wafer 26. Power is applied to the arm 60 so that the plate 64 is positively charged and the contacting member 76 is negatively charged, thereby creating an electrostatic attractive force which chucks the wafer 26 onto the arm 60. Simultaneously, controller 56 operates the power supply 84 so that the charge on electrode 80 is reversed from positive to negative. With the wafer 26 held on the arm 60, arm 60 is retracted from the chamber to transport the wafer 26 back to the load lock or cassette. Power supply 84 may then be turned off.

From the foregoing, it is apparent that the electrostatic transporting and chucking system described above not only provides for the reliable accomplishment of the objects of the invention, but does so in a particularly simple and economical manner. It is recognized, of course, that those skilled in the art may make various modifications and additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A unipolar electrostatic chuck for holding a semiconductor wafer or the like, comprising:

a first electrically conductive member having a wafer-attracting surface extending parallel to and essentially coextensive with said wafer;

a second electrically conductive member surrounding said first member and having a wafer-engaging edge extending beyond said wafer-attracting surface, said wafer-engaging edge engaging the outer periphery of said wafer and holding said wafer in spaced relationship to said wafer-attracting surface so as to form a gap therebetween;

a layer of electrically insulating material between said first and second members;

an outer housing surrounding said first conductive member and formed of an electrically insulating material, said housing including an outer edge extending beyond said wafer engaging edge and contacting the sides of said wafer to hold said wafer against lateral movement when said wafer is in engagement with said wafer engaging surface; and, an electrical power supply having first and second terminals of opposite polarity respectively connected to said first and second conductive members.

2. The electrostatic chuck of claim 1, wherein said first and second conductive members and said housing each have a cut out area therein through which a wafer lifter may pass for removing said wafer from said chuck.

3. The electrostatic chuck of claim 1, wherein said dielectric layer includes a section overlying said wafer attracting-surface and spaced from said wafer when said wafer is in engagement with engaging edge of said second member.

4. The electrostatic chuck of claim 1, wherein said second conductive member is generally cup-shaped.

5. The electrostatic chuck of claim 1, including an arm secured to and supporting said housing.

6. The electrostatic chuck of claim 1, wherein said outer edge of said housing includes a contoured surface for guiding said wafer into registration with said wafer engaging-edge.

7. The electrostatic chuck of claim 1, wherein said second member includes a generally cylindrical side wall and a bottom wall.

8. The electrostatic chuck of claim 7, wherein said housing includes a generally cylindrical sidewall sleeved over the sidewall of said second member.

* * * * *